US009922936B1

(12) United States Patent
Lavanga et al.

(10) Patent No.: US 9,922,936 B1
(45) Date of Patent: Mar. 20, 2018

(54) SEMICONDUCTOR LITHOGRAPHY ALIGNMENT FEATURE WITH EPITAXY BLOCKER (71) Applicant: Infineon Technologies Austria AG, Villach (AT)

(72) Inventors: Simone Lavanga, Faak am See (AT); Uttiya Chowdhury, Villach (AT); Mattia Capriotti, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/250,991

(22) Filed: Aug. 30, 2016

(51) Int. Cl.
H01L 23/544 (2006.01)
H01L 21/02 (2006.01)
(Continued)

(52) U.S. Cl.
CPC ........ H01L 23/544 (2013.01); H01L 21/0206 (2013.01); H01L 21/0214 (2013.01); H01L 21/0217 (2013.01); H01L 21/02118 (2013.01); H01L 21/02164 (2013.01); H01L 21/02318 (2013.01); H01L 21/02387 (2013.01); H01L 21/02538 (2013.01); H01L 21/02658 (2013.01); H01L 21/30621 (2013.01); H01L 21/78 (2013.01); H01L 29/20 (2013.01); H01L 2223/5446 (2013.01); H01L 2223/54426 (2013.01)

(58) Field of Classification Search
CPC ... H01L 23/544–23/556; H01L 21/68–21/682; H01L 21/2018; H01L 21/2022; H01L 21/2026; H01L 21/2036; H01L 21/2056; H01L 21/2085; H01L 21/02387–21/02398; H01L 21/02634–21/02642; H01L 21/02538–21/02549; H01L 21/02455–21/02466; H01L 21/02488; H01L 2223/544–2223/54493
See application file for complete search history.

(56) References Cited

U.S. PATENT DOCUMENTS

2004/0135226 A1* 7/2004 Yoshimura ........ H01L 21/76264
257/499
2008/0200004 A1* 8/2008 Nomaguchi ........... B82Y 10/00
438/401
(Continued)

Primary Examiner — Lauren R Bell
(74) Attorney, Agent, or Firm — Murphy, Bilak & Homiller, PLLC (57) ABSTRACT A type III-V semiconductor substrate is provided. Semiconductor material is removed from the type III-V semiconductor substrate such that the type III-V semiconductor substrate comprises one or more alignment features extending away from a main lateral surface. Each of the alignment features includes a first lateral surface that is vertically offset from the main lateral surface, and first and second vertical sidewalls that extend between the first lateral surface and the main lateral surface. An epitaxy blocker is formed on the first and second vertical sidewalls of each alignment feature. A type III-V semiconductor regrown layer is epitaxially grown on a portion of the semiconductor wafer that includes the one or more alignment features. The epitaxy blocker prevents the type III-V semiconductor regrown layer from forming on the first and second vertical sidewalls of the one or more alignment features.

17 Claims, 9 Drawing Sheets (51) Int. Cl.
  *H01L 21/78*      (2006.01)
  *H01L 21/306*     (2006.01)
  *H01L 29/20*      (2006.01)

(56) References Cited

U.S. PATENT DOCUMENTS

| | | | |
|---|---|---|---|
| 2013/0230339 A1* | 9/2013 | Ogihara | B41J 2/45 399/220 |
| 2016/0268312 A1* | 9/2016 | Wang | H01L 21/02532 |
| 2017/0090299 A1* | 3/2017 | Chen | G03F 7/70141 |

* cited by examiner

SEMICONDUCTOR LITHOGRAPHY ALIGNMENT FEATURE WITH EPITAXY BLOCKER

TECHNICAL FIELD

The present application relates to semiconductor device formation, and in particular to semiconductor device formation alignment techniques.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. HEMTs are preferred in many applications due to their favorable power density, on-state resistance, switching frequency, and efficiency benefits over over conventional silicon based transistors.

HEMTs are typically formed from type III-V semiconductor materials, such as GaN, GaAs, InGaN, AlGaN, etc. In a GaN/AlGaN based HEMT, a two-dimensional electron gas (2DEG) arises at the interface between the AlGaN barrier layer and the GaN buffer layer. The 2DEG forms the channel of the device instead of a doped region, which forms the channel in a conventional MOSFET device. Similar principles may be utilized to select buffer and barrier layers that form a two-dimensional hole gas (2DHG) as the channel of the device. A 2DEG or a 2DHG is generally referred to as a two-dimensional carrier gas.

Epitaxial growth techniques are commonly used to form semiconductor substrates that include the type III-V semiconductor material for the formation of HEMT devices therein. According to one technique, a base substrate that includes readily available semiconductor material, such as silicon or silicon carbide, is provided. Several epitaxial layers of type III-V semiconductor material are formed on the base substrate, Intermediary layers, such as AlN layers, may be used to facilitate epitaxial growth and to improve electrical performance of the substrate.

Recently, epitaxial regrowth techniques are gaining favor as a preferred technique for forming type III-V semiconductor substrates. According to this technique, a type III-V semiconductor layer is epitaxially grown and partially removed. Subsequently, a type III-V semiconductor layer is regrown on the original type III-V semiconductor layer. The regrown layer has improved electrical characteristics in comparison to the original layer. This improvement can lead to an HEMT with lower RDSON (on-resistance) with the same pitch.

One challenge with respect to epitaxial regrowth relates to alignment of the device features that are formed in the regrown layer. In many cases, the regrown epitaxial layer may include structured regions that need to be aligned with structured regions in subjacent layers. Examples of these structured regions include emitter junctions and gate junction.

One technique for aligning structured regions in a semiconductor substrate involves utilizing three dimensional alignment features around the periphery of the active device area. These alignment features provide a reference point from which to ensure that different masks are centered with respect to one another. However, this technique is not compatible with epitaxial regrowth techniques because the epitaxially regrown layer covers the alignment features and makes the alignment features difficult or impossible to distinguish by the processing equipment.

SUMMARY

According to an embodiment, a method of forming a semiconductor device is disclosed. The method includes providing a type III-V semiconductor substrate, and removing semiconductor material from the type III-V semiconductor substrate such that the type III-V semiconductor substrate comprises one or more alignment features extending away from a main lateral surface of the type III-V semiconductor substrate. Each of the alignment features includes a first lateral surface that is vertically offset from the main lateral surface, and first and second vertical sidewalls that extend between the first lateral surface and the main lateral surface. The method further includes forming an epitaxy blocker on the first and second vertical sidewalls of each alignment feature, and epitaxially growing a type III-V semiconductor regrown layer on a portion of the semiconductor wafer that includes the one or more alignment features. The epitaxy blocker prevents the type III-V semiconductor regrown layer from forming on the first and second vertical sidewalls of the one or more alignment features.

A method fabricating an alignment feature for a type III-V semiconductor wafer is disclosed. According to an embodiment, the method includes providing a type III-V semiconductor wafer having a plurality of die sites and a dicing strip separating the die sites from one another, and forming one or more electrically inactive alignment features in the dicing strip. Each of the alignment features includes a first lateral surface that is vertically offset from a main lateral surface of the type III-V semiconductor wafer, and first and second vertical sidewalls that extend between the first lateral surface and the main lateral surface. The method further includes forming an epitaxy blocker on the first and second vertical sidewalls of each alignment feature. The epitaxy blocker includes material that prohibits epitaxial growth.

A type III-V semiconductor wafer is disclosed. According to an embodiment, the type III-V semiconductor wafer includes a plurality of die sites, a dicing strip separating the die sites from one another, and one or more electrically inactive alignment features in the dicing strip. Each of the alignment features includes a first lateral surface that is vertically offset from a main lateral surface of the type III-V semiconductor wafer, and first and second vertical sidewalls that extend between the first lateral surface and the main lateral surface. The type III-V semiconductor wafer further includes an epitaxy blocker disposed along the first and second vertical sidewalls of each alignment feature, the epitaxy blocker including material that prohibits epitaxial growth, and a type III-V semiconductor regrown layer disposed on the type III-V semiconductor wafer. The type III-V semiconductor regrown layer at least partially covers the main lateral surface of the type III-V semiconductor afer and the first lateral surface of each alignment feature. The the type III-V semiconductor regrown layer is absent from the first and second sidewalls of each of the alignment features.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes FIGS. 2A and 2B, illustrates a cross-sectional view of a type III-V semiconductor substrate with alignment features formed in the substrate, according to an embodiment. FIG. 2A depicts trench style alignment features and FIG.2B depicts mesa style alignment features.

FIG. 3, which includes FIGS. 3A and 3B, illustrates a cross-sectional view of forming a regrown epitaxial layer directly on the alignment features of FIGS. 2A and 2B without any further measures to prevent lateral epitaxial growth along sidewalls of the alignment features, according to an embodiment.

FIG. 4, which includes FIGS. 4A and 4B, illustrates a cross-sectional view of forming a conformal layer of an epitaxy blocker material directly on the alignment features of FIGS. 2A and 2B, according to an embodiment.

FIG. 5, which includes FIGS. 5A and 5B, depicts a cross-sectional view of selectively removing portions of the conformal layer that are outside of the sidewalls of the alignment features, according to an embodiment.

FIG. 6, which includes

FIG. 7, which includes

DETAILED DESCRIPTION

According to embodiments described herein, semiconductor alignment features are formed and processed in such a way that the topology of the alignment features remains intact and is clearly visible after a type III-V regrown epitaxial layer is formed over the alignment features. The alignment features can be trench structures that vertically extend into the semiconductor substrate. Alternatively, the alignment features can be mesa structures that vertically extend away from the semiconductor substrate. According to techniques described herein, a material that blocks the epitaxial growth of type III-V semiconductor material is selectively formed along vertical sidewalls of the alignment features. Subsequently, a type III-V semiconductor layer is epitaxially grown on the substrate. The regrown type III-V semiconductor layer grows everywhere except the vertical sidewalls, due to the presence of the epitaxy blocker being disposed in these locations. Thus, after the epitaxial regrowth, the vertical faces of the alignment features remain clearly defined. Subsequently, the alignment features can be used to correctly position a structured mask that is formed on the regrown layer.

Figure 1:
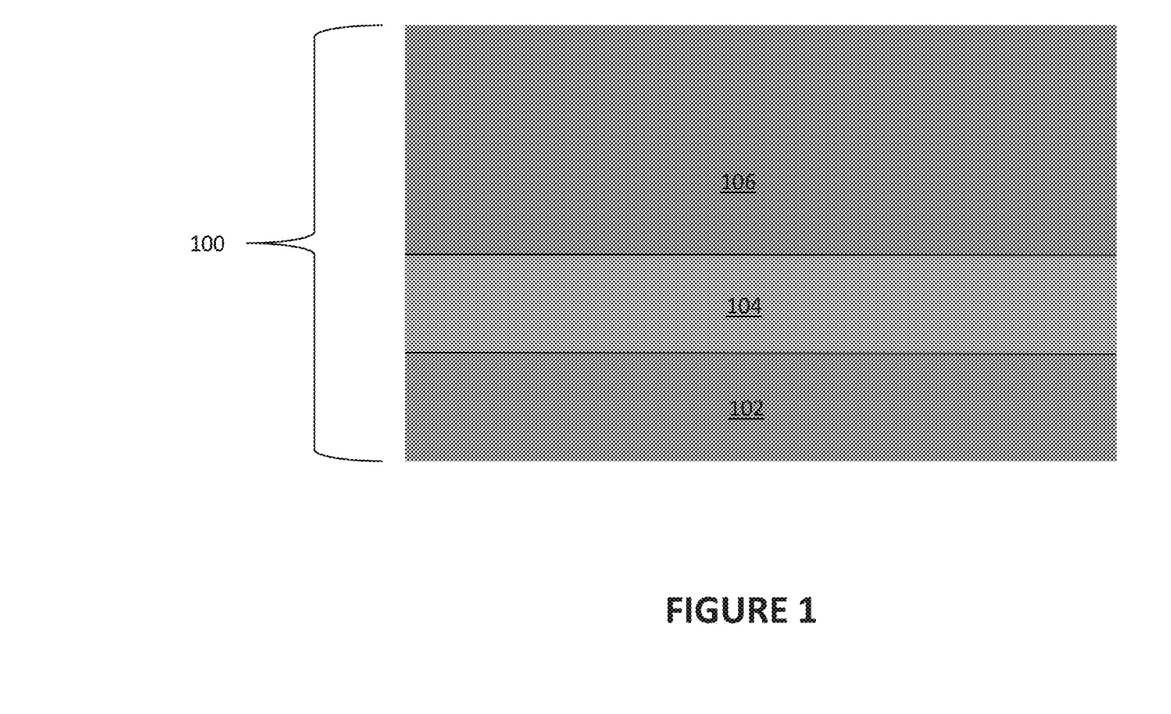
FIG. 1 illustrates a cross-sectional view of a type III-V semiconductor substrate, according to an embodiment.

Referring to FIG. 1, a type III-V semiconductor substrate 100 is depicted. The type III-V semiconductor substrate 100 includes a base substrate 102. The base substrate 102 can be a bulk substrate or can be an epitaxial formed layer. In general, the base substrate 102 can include any crystalline semiconductor material suitable for manufacturing semiconductor devices, and in particular can include any material suitable for the epitaxial growth of a type III-V semiconductor material thereon. Exemplary materials for base substrate 102 include silicon (Si), group IV compound semiconductor materials such as silicon carbide (SiC) or silicon germanium (SiGe). Alternatively, the base substrate 102 can include a type III-V semiconductor including gallium nitride (GaN), gallium arsenide (GaAs), aluminium nitride (AlN), aluminium arsenide (AlAs), indium nitride (InN), indium arsenide (InAs), etc.

The type III-V semiconductor substrate 100 further includes a first epitaxial layer 104 that is epitaxially formed on the base substrate 102. Generally speaking, the first epitaxial layer 104 can include any type III-V semiconductor material such as gallium nitride (GaN), gallium arsenide (GaAs), aluminium nitride (AlN), aluminium arsenide (AlAs), indium nitride (InN), indium arsenide (InAs), etc. The first epitaxial layer 104 can also include ternary or quarternary type III-V semiconductor materials such as aluminium gallium nitride (AlGaN), aluminium gallium arsenide (AlGaAs), indium gallium nitride (InGaN), indium aluminium gallium nitride (InAlGaN), etc.

The type III-V semiconductor substrate 100 further includes a second epitaxial layer 106 that is epitaxially formed on the first epitaxial layer 104. Generally speaking, the second epitaxial layer 106 can include any type III-V semiconductor material such as gallium nitride (GaN), gallium arsenide (GaAs), aluminium nitride (AlN), aluminium arsenide (AlAs), indium nitride (InN), indium arsenide (InAs), etc. The second epitaxial layer 106 can also include ternary or quarternary type III-V semiconductor materials such as aluminium gallium nitride (AlGaN), aluminium gallium arsenide (AlGaAs), indium gallium nitride (InGaN), indium aluminium gallium nitride (InAlGaN), etc.

Figure 2:
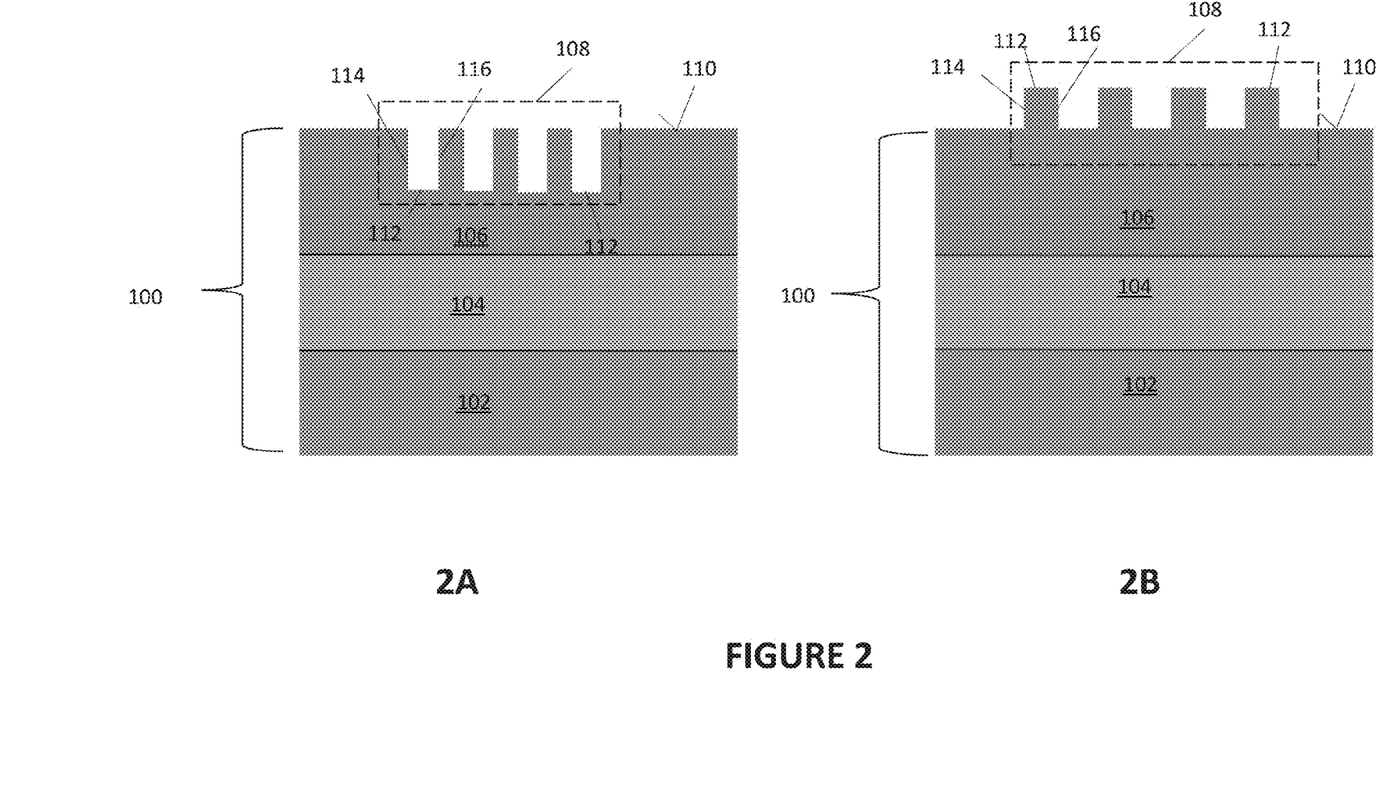

Referring to FIG. 2, the type III-V semiconductor substrate 100 has been processed to form one or more alignment features 108. According to an embodiment, the alignment features 108 are electrically inactive features. That is, the alignment features 108 have no electrical connectivity to and do not influence the functionality of active semiconductor devices, e.g., transistors, diodes, etc.

The structural configuration of the alignment features 108 may vary. Two examples are shown in FIG. 2. FIG. 2A depicts trench style alignment features 108 and FIG. 2B depicts mesa style alignment features 108. The trench style alignment features 108 extend away from a main lateral surface 110 of the type III-V semiconductor substrate 100 in the vertical direction. The mesa style alignment features 108 also extend away from the main lateral surface 110 in the vertical direction, but in an opposite orientation as the mesa style alignment features 108. For either style, the alignment features 108 include a first lateral surface 112 that is vertically offset from the main lateral surface 110. Moreover, for either style, the alignment features 108 include first and second vertical sidewalls 114, 116 that extend between the first lateral surface 112 and the main lateral surface 110. The first and second vertical sidewalls 114, 116 extend at least partially in a vertical direction that is perpendicular to the main lateral surface 110.

The trench style alignment features 108 of FIG. 2A vertically extend into the III-V semiconductor substrate such that the first lateral surface 112 of the trench style alignment features 108 forms a bottom of the trenches. By contrast, the mesa style alignment features 108 vertically extend away from the type III-V semiconductor substrate 100 such that the first lateral surface 112 of the mesa style alignment features 108 forms a plateau of the mesa structures.

The orientation of the first and second vertical sidewalls 114, 116 relative to the first lateral surface 112 and the main lateral surface 100 may vary. According to an embodiment, the main lateral surface 110 is parallel to the first lateral surface 112, and the first and second vertical sidewalls 114, 116 are perpendicular both the main lateral surface 110 and the first lateral surface 112. Alternatively, the first and second vertical sidewalls 114, 116 may form oblique angles with the main lateral surface 110 and/or the first lateral surface 112. For example, the alignment features 108 (either the trench style or the mesa style) can gradually narrow or widen with increasing distance from the main lateral surface 110. The first lateral surface 112 and the first and second vertical sidewalls 114, 116 can be, but are not necessarily, completely planar surfaces. Multi-tiered structures as possible as well, In any case, the alignment features 108 have at east two surfaces that vertically extend away from (but are not necessarily perpendicular to) the main lateral surface 110.

According to an embodiment, the alignment features 108 are formed by removing semiconductor material from the type III-V semiconductor substrate 100. For example, the alignment features 108 can be formed by wet or dry etching of semiconductor material away from the second epitaxial layer 106. This can be done according to any commonly known masked etching technique. In the case of the trench style alignment features 108 of FIG. 2A, the trenches correspond to the etched portions of the type III-V semiconductor substrate 100. In the case of the mesa style alignment features 108 of FIG. 2B, the mesas corresponds to the portions of the type III-V semiconductor substrate 100 that are not etched.

Figure 3:
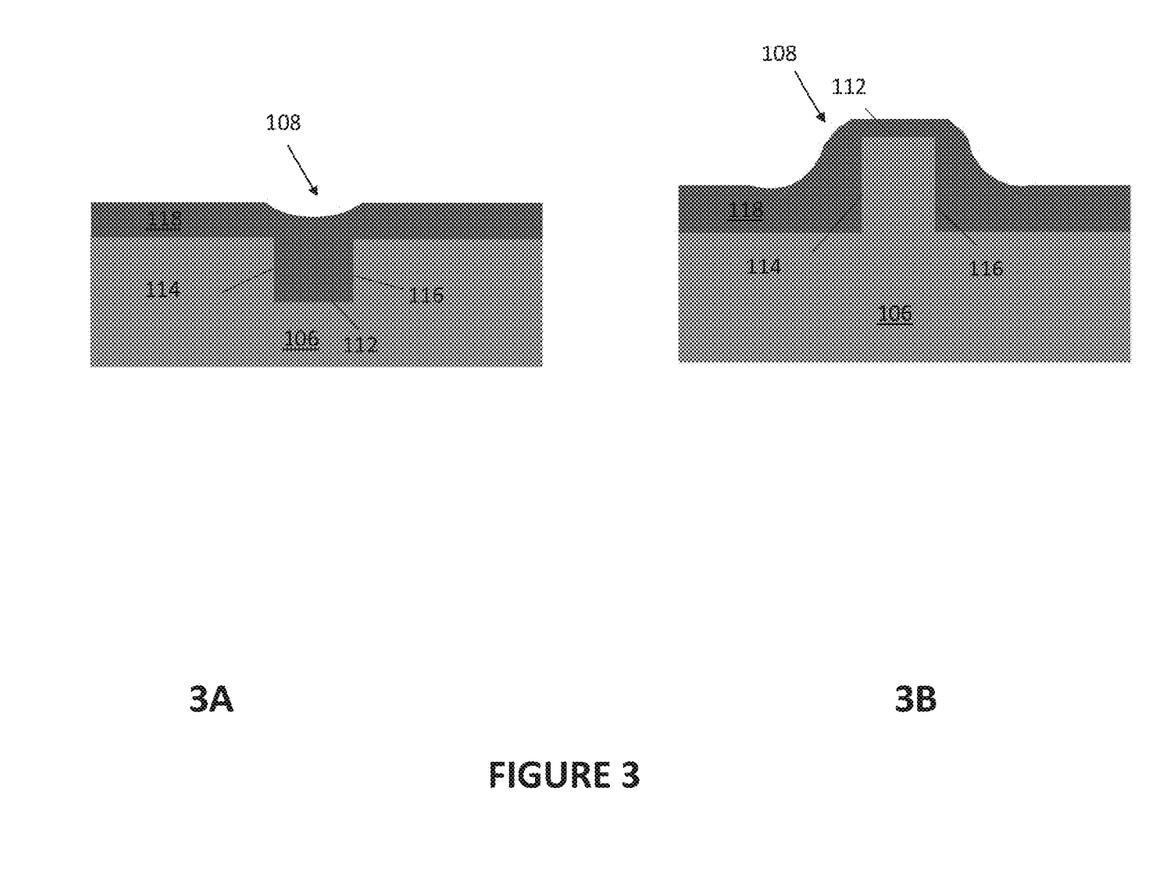

Referring to FIG. 3, direct growth of an epitaxial layer 118 on the alignment features 108 without any intervening material to influence the growth of the epitaxial layer 118 is shown. FIG. 3A depicts a close-up view one of the trench style alignment features 108 and FIG. 3B depicts a close-up view of one of the mesa style alignment features 108. In both cases, an epitaxial layer 118 is formed directly on the alignment features 108 with no other materials disposed between. The epitaxial layer 118 can include any type III-V semiconductor material, such as GaN, AlGaN, etc.

As can be seen, the epitaxial layer 118 covers the alignment features 108 in such a way that geometry of these structures is obfuscated. That is, the vertical definition of the sidewalls of the alignment features 108 of the second epitaxial layer 106 is substantially smoothened in the epitaxial layer 118 such that the slope of the sidewalls in the epitaxial layer 118 is much shallower. As a result, the alignment features 108 have little contrast when seen from above and are unrecognizable at sufficiently high thickness values for the epitaxial layer 118. This is due in part to the fact that the epitaxial layer 118 grows along the first and second vertical sidewalls 114, 116 of the alignment features 108. Thus, the trenches of the trench style alignment features 108 become partially filled in as illustrated in FIG. 3A. Likewise, the mesas of the style alignment features 108 are less pronounced.

FIGS. 4-7 illustrate a technique for preventing the epitaxial layer from obfuscating the alignment features 108 in the manner described with reference to FIG. 3 by forming an epitaxy blocker on the first and second vertical sidewalls 114, 116 of each of the alignment features 108 before the epitaxial deposition step.

Figure 4:
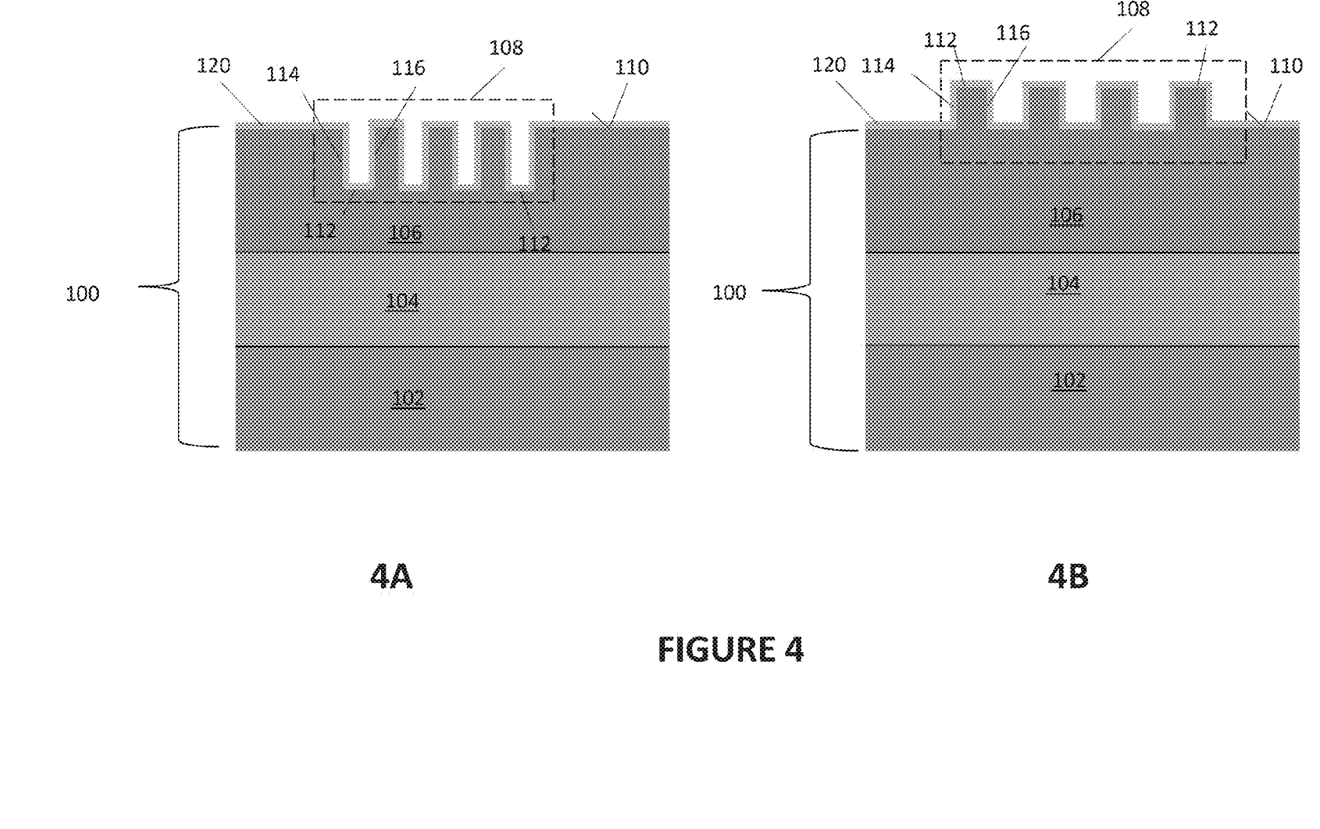

Referring to FIG. 4, a photoresist mask (not shown) that is used to form the alignment features 108 may be removed, and the surface of the type III-V semiconductor substrate 100 may be cleaned using well-known techniques. Before any further epitaxial layers are grown on the second epitaxial layer 106 a conformal layer 120 is formed on a portion of the type III-V semiconductor substrate 100 that includes the alignment features 108. The conformal layer 120 is formed so as to completely line the first and second sidewalls 114, 116 of each alignment feature.

According to an embodiment, the conformal layer 120 includes an epitaxy blocker material. Generally speaking, the epitaxy blocker material can be any material that resists epitaxial growth of semiconductor materials thereon, and in particular resists the epitaxial formation of type III-V semiconductor materials thereon. Examples of these materials include type IV semiconductor oxides, nitrides and carbides. For example, the epitaxy blacker material can include silicon dioxide ($SiO_2$), silicon nitride (SiN), carbon nitride (CN), and silicon oxynitride ($SiO_xN_y$). The conformal layer 120 can be a single layer one of these materials or alternatively can be a compound layer that includes two or more epitaxy blocker materials. The conformal layer 120 can be formed by annealing the type III-V semiconductor substrate 100 in an oxygen rich or nitrogen rich environment, for example. The conformal layer 120 can have different thicknesses, depending on, e.g., the size of the alignment features 108, type of epitaxy blocker material, type of epitaxial material to be grown on the conformal layer 120, etc, According to one embodiment, the conformal layer 120 has a thickness of between 50 nm (nanometres) and 100 nm, and according to a more particular embodiment the conformal layer 120 has a thickness of 75 nm.

Figure 5:
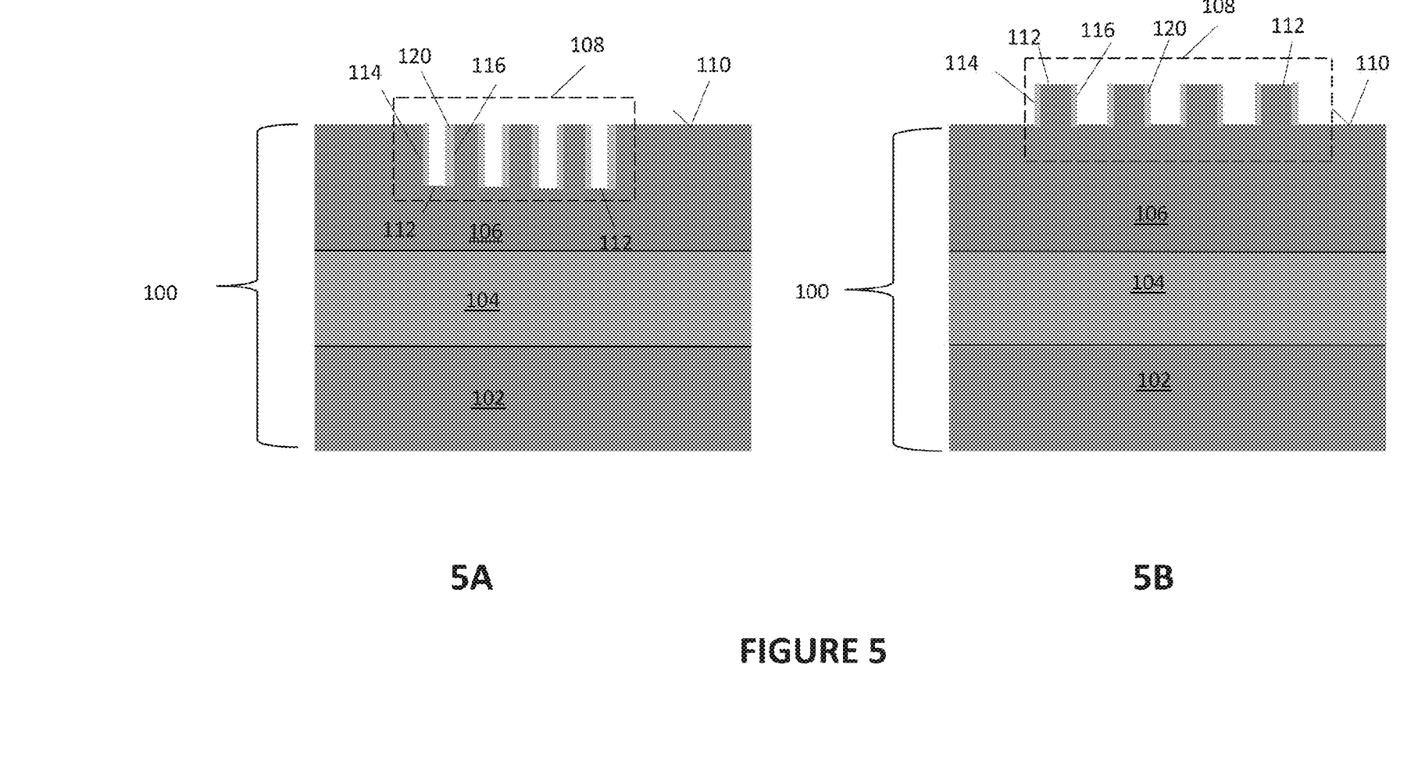

Referring to FIG. 5, the conformal layer 120 is selectively removed from portions of the type III-V semiconductor substrate 100. Specifically, the conformal layer 120 is selectively removed from the main lateral surface 110 and the first lateral surface 112 of each of the alignment features 108. That is, the conformal layer 120 is removed from every location on the type III-V semiconductor substrate 100 except the first and second vertical sidewalls 114, 116 of each of the alignment features 108. As a result, the first and second vertical sidewalls 114, 116 are covered by the epitaxy blocker, while the adjacent surfaces are exposed from the epitaxy blocker.

The conformal layer 120 may be selectively removed from portions of the type III-V semiconductor substrate 100 using an etching process, for example. In general, the etching process can be any anisotropic etching process. According to an embodiment, the conformal layer 120 is removed from the main lateral surface 110 and from the first lateral surface 112 of each of the alignment features 108 using an anisotropicetching low damage plasma (ICP plasma) process.

After selectively removing the conformal layer 120, further semiconductor processing may be performed to prepare the type III-V semiconductor substrate 100 for epitaxial growth thereon. According to an embodiment, a surface cleaning process is performed. The surface cleaning process can be an RCA (Radio Corporation of America) cleaning process. Subsequently, high temperature processing (e.g., 700°-1000° C. semiconductor processing) can be performed. For example, the type III-V semiconductor substrate 100 can be annealed in a hydrogen atmosphere at approximately 800° C. This process increases the density of the epitaxy blocker material that is present on the first and second vertical sidewalls 114, 116 and removes contaminants from the exposed surfaces of the type III-V semiconductor substrate 100.

Figure 6A:
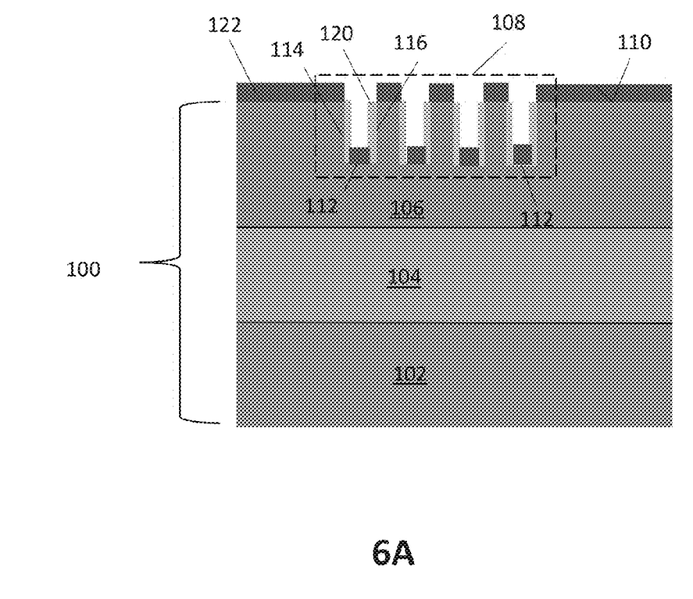
FIGS. 6A and 6B, depicts a cross-sectional view of forming a regrown epitaxial layer on the alignment features with epitaxy blocker material present on sidewalls of the alignment features, according to an embodiment.
Figure 6B:
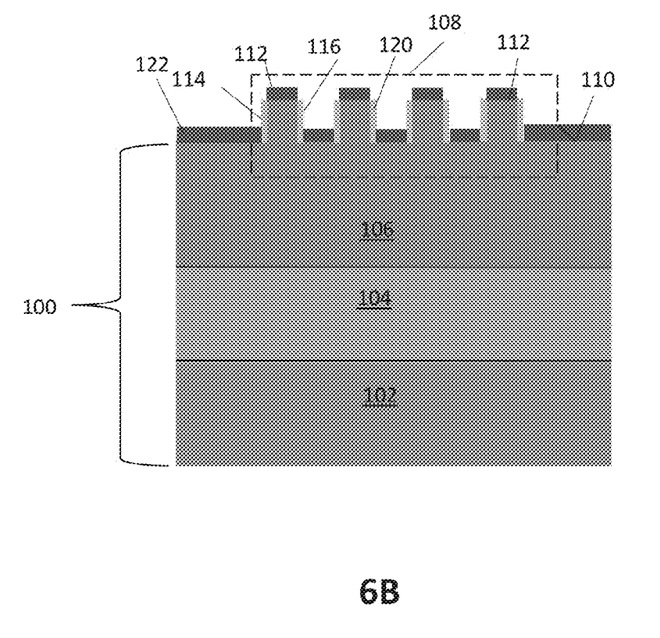

Referring to FIG. 6, a type III-V semiconductor regrown layer 122 is epitaxially grown on a portion of the type III-V semiconductor substrate 100 that includes the one or more alignment features 108. FIG. 6A depicts the type III-V semiconductor regrown layer 122 being formed on the trench style alignment features 108 and FIG. 2B depicts the type III-V semiconductor regrown layer 122 being formed on the mesa style alignment features 108. The type III-V semiconductor regrown layer 122 can include any type III-V semiconductor material such as gallium nitride (GaN), gallium arsenide (GaAs), aluminium nitride (AlN), aluminium arsenide (AlAs), indium nitride (InN), indium arsenide (InAs), etc. The type III-V semiconductor regrown layer 122 can include ternary or quaternary type III-V semiconductor materials such as aluminium gallium nitride (AlGaN), aluminium gallium arsenide (AlGaAs), indium gallium nitride (InGaN), indium aluminium gallium nitride (InAlGaN), etc.

Due to the presence of the epitaxy blocker on the first and second vertical sidewalls 114, 116 of the alignment features 108, the type III-V semiconductor regrown layer 122 is prevented from forming in these locations. That is, the type III-V semiconductor regrown layer 122 vertically grows on the main lateral surface 110 and the first lateral surface 112 of the alignment features 108, but is prevented from laterally growing on the first and second vertical sidewalls 114, 116 of the alignment features 108. As a result, the obfuscation of the alignment features 108 described with reference to FIG. 3 is avoided, and the basic geometry of the alignment features 108 remains intact after the formation of the type III-V semiconductor regrown layer 122. Accordingly, the type III-V semiconductor regrown layer 122 can be made substantially thicker than in the case of FIG. 3 without risk of obfuscating the alignment features 108. With the current techniques, the thickness of the type III-V semiconductor regrown layer 122 is only limited by the vertical height/depth of the alignment features 108.

Figure 7A:
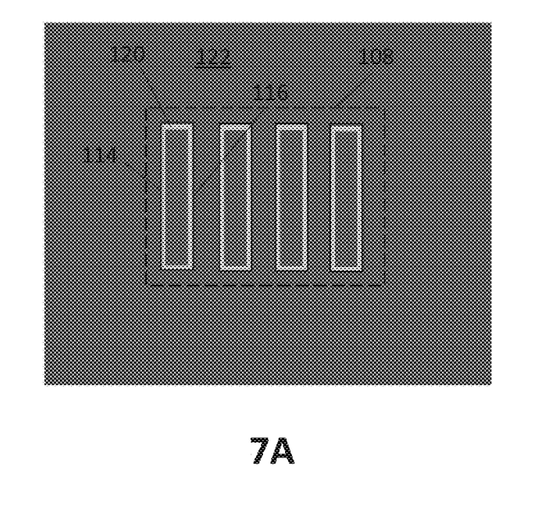
FIGS. 7A and 7B, depicts a plan-view of the substrate with the regrown epitaxial layer formed on the alignment features and with epitaxy blocker formed on the alignment features, according to an embodiment.
Figure 7B:
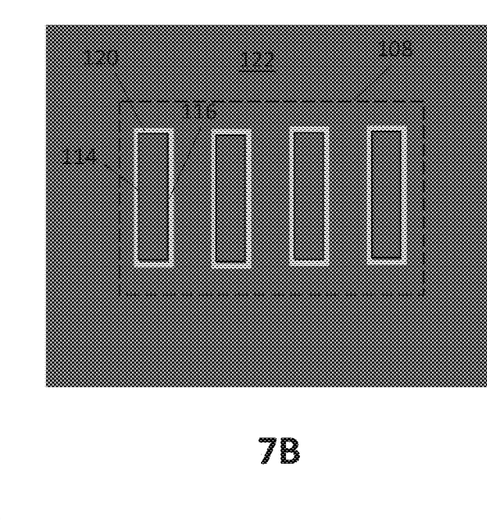

Referring to FIG. 7, a plan-view of the type III-V semiconductor substrate 100 with the type III-V semiconductor regrown layer 122 being formed on the alignment features 108 is depicted. FIG. 7A depicts a plan-view of the trench style alignment features 108 and FIG. 7B depicts a plan-view of the mesa style alignment features 108. As can be seen, the alignment features 108 are clearly visible from above after the formation of the type III-V semiconductor regrown layer 122. Accordingly, the alignment features 108 are clearly discernible to process tools, such as optical photography tools, and can be used to accurately position a mask over the type III-V semiconductor regrown layer 122.

Figure 8:
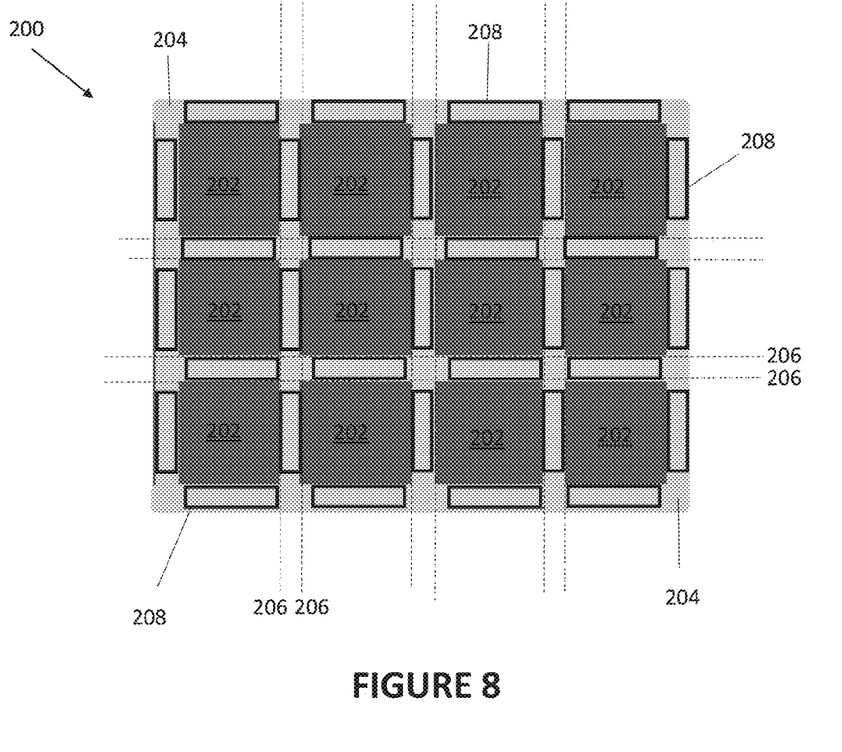
FIG. 8 depicts a plan-view of semiconductor wafer with alignment features disposed in a wafer dicing strip, according to an embodiment.

Referring to FIG. 8, a plan-view of a semiconductor wafer 200 is depicted. The semiconductor wafer 200 includes the features of the semiconductor body described with reference to FIGS. 1-7. That is, the semiconductor wafer 200 includes the base substrate 102, the first epitaxial layer 104, the second epitaxial layer 106, the type III-V semiconductor regrown layer 122, and the alignment features 108.

The semiconductor wafer 200 includes a plurality of die sites 202. Each die site 202 includes one or more active semiconductor devices, e.g., MOSFETs, HEMTs, diodes, BJTs, etc. The die sites 202 include device structures such as doped regions (e.g., source regions, drain regions, etc.) conductive structures (e.g., gate electrodes, contacts, conductive pads, etc.). Each die site 202 can be separated from the semiconductor wafer 200 to form an integrated circuit, such as a power transistor, diode, processor, control circuit, etc.

The semiconductor wafer 200 further includes a dicing strip 204 separating the die sites 202 from one another. The dicing strip 204 is an electrically inactive portion of the semiconductor wafer 200 that is devoid of any active semiconductor devices. After semiconductor processing for each die is complete, the semiconductor wafer 200 can be cut along scribe lines 206 so as to separate the die sites 202 from one another and from the dicing strip 204. The remaining portions of the dicing strip 204 can be discarded.

According to an embodiment, the alignment features 108 are provided at locations 208 in the dicing strip 204. The alignment features 108 can be provided between some or all of the die sites 202 in the semiconductor wafer 200. In addition or in the alternative, the alignment features 108 can be provided at locations (not shown) within the area of each die site 202.

Figure 9:
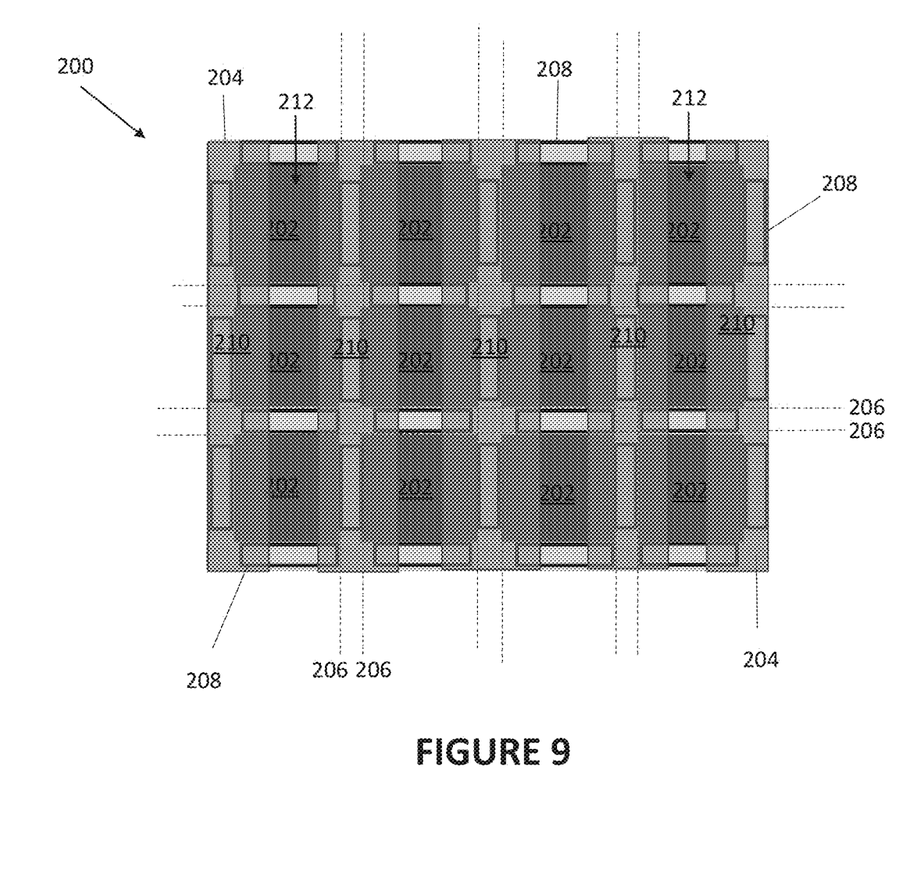
FIG. 9 depicts a plan-view of semiconductor wafer with alignment features disposed in a wafer dicing strip and a photomask formed over the wafer, according to an embodiment.

Referring to FIG. 9, a lithography mask 210 has been formed on the semiconductor wafer 200. Generally speaking, the lithography mask 210 can be any kind of photomask and can include any kind of photoresist material that is compatible with photolithography. The lithography mask 210 is patterned with openings 212 that are disposed over the die sites 202, The openings 212 can be used to form structured features in or on the type III-V semiconductor regrown layer 122 for each die. Examples of these structured features include doped regions, dielectric structures, conductive structures, etc. The alignment features 108 that are located in the dicing strip 204 are used the correctly position the lithography mask 210 such that the openings 212 are properly aligned. The alignment features 108 are easily recognized by the processing equipment and are used as a reference point. In this way, features that are formed in or on the type III-V semiconductor regrown layer 122 can be aligned with features that are formed in subjacent semiconductor layers (e.g., the second epitaxial layer 106).

In a broad sense, the compound semiconductor device described herein can be formed from any binary, ternary or quaternary III-nitride compound semiconductor material where piezoelectric effects are responsible for the device concept. The epitaxial layers can be manufactured on a semiconductor substrate such as a Si or SiC substrate, on which a nucleation (seed) layer such as an AlN layer can be formed for providing thermal and lattice matching to the epitaxial layers. The compound semiconductor device also may have AlInN/AlN/GaN barrier/spacer/buffer layer structures. In general, the compound semiconductor device can be realized using any suitable III-nitride technology such as GaN that permits the formation of opposite polarity inversion regions due to piezoelectric effects.

Spatially relative terms such as "under," "below," "lower," "over," "upper," and the like, are used for ease of description to explain the positioning of one element relative to a second element. These terms are intended to encompass different orientations of the package in addition to different orientations than those depicted in the figures. Further, terms such as "first," "second," and the like, are also used to describe various elements, regions, sections, etc. and are also not intended to be limiting. Like terms refer to like elements throughout the description.

As used herein, the term "lateral," "laterally," and the like refer to a direction that is parallel to the main surface of the substrate. The term "vertical," "vertically," and the like refer to a direction that is perpendicular to the main surface of the substrate. For example, the main surface of the substrate can be mapped to an X,Y axis and the vertical direction can be mapped to the X axis. Features that "extend" in the vertical direction are not necessarily parallel to the vertical direction, but rather have a vector component that is parallel to the vertical direction.

As used herein, the terms "having," "containing," "including," "comprising," and the like are open-ended terms that indicate the presence of stated elements or features, but do not preclude additional elements or features. The articles "a," "an," and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a semiconductor device, comprising: providing a type III-V semiconductor substrate;
   structuring the type III-V semiconductor substrate such that the type III-V semiconductor substrate comprises one or more alignment features extending away from a main lateral surface of the type III-V semiconductor substrate, each of the alignment features comprising a first lateral surface that is vertically offset from the main lateral surface, and first and second vertical sidewalls that extend between the first lateral surface and the main lateral surface;
   forming an epitaxy blocker exclusively along the first and second vertical sidewalls of each of the alignment features such that the first lateral surface and the main lateral surface of the type III-V semiconductor substrate are exposed from the epitaxy blocker; and
   epitaxially growing a type III-V semiconductor regrown layer on a portion of the type III-V semiconductor substrate that includes the one or more alignment features,
   wherein, during the epitaxial growth of the type III-V semiconductor regrown layer, the type III-V semiconductor regrown layer forms directly on portions of the first lateral surface and the main lateral surface that are exposed from the epitaxy blocker, and
   wherein, during the epitaxial growth of the type III-V semiconductor regrown layer, the epitaxy blocker prevents the type III-V semiconductor regrown layer from forming on the first and second vertical sidewalls of the one or more alignment features.

2. The method of claim 1, wherein the one or more alignment features are electrically inactive structures.

3. The method of claim 2, wherein the type III-V semiconductor substrate comprises a plurality of die sites and a dicing strip separating the die sites from one another, and wherein the one or more alignment features are formed in the dicing strip.

4. The method of claim 3, further comprising:
   cutting the type III-V semiconductor substrate along the dicing strip so as to separate the die sites from one another and from the dicing strip.

5. The method of claim 2, further comprising forming one or more active devices in the die sites, wherein forming the one or more active devices comprises:
   providing a lithography mask on the type III-V semiconductor substrate;
   using the one or more alignment features to position openings in the lithography mask; and
   forming one or more structured features in the type III-V semiconductor regrown layer using the lithography mask.

6. The method of claim 1, wherein forming the epitaxy blocker exclusively along the first and second sidewalls of each of the alignment features comprises:
   depositing a conformal layer of the epitaxy blocker on a portion of the semiconductor type III-V semiconductor substrate that includes the main lateral surface and the one or more alignment features; and
   removing portions of the conformal layer that form on the first lateral surface of each of the alignment features and the main lateral surface.

7. The method of claim 6, wherein removing portions of the conformal layer that form on the first lateral surface of each of the alignment features comprises an anisotropic etching low damage plasma process.

8. The method of claim 1, further comprising, after forming the epitaxy blocker exclusively along the first and second sidewalls of each of the alignment features and before epitaxially growing the type III-V semiconductor regrown layer:
   cleaning the first lateral surface of each of the alignment features and the main lateral surface;
   densifying the epitaxy blocker; and
   removing surface defects from the type III-V semiconductor substrate.

9. The method of claim 1, wherein forming the one or more alignment features in the type III-V semiconductor substrate comprises forming trenches that vertically extend into the type III-V semiconductor substrate, and wherein the first lateral surface forms a bottom of the trenches.

10. The method of claim 1, wherein forming the one or more alignment features in the type III-V semiconductor substrate comprises forming mesa structures that vertically extend away from the type III-V semiconductor substrate, and wherein the first lateral surface forms a plateau of the mesa structures.

11. The method of claim 1, wherein the epitaxy blocker comprises an oxide or nitride material.

12. The method of claim 11, wherein the epitaxy blocker comprises any one or more of: silicon dioxide ($SiO_2$), silicon nitride (SiN), carbon nitride (CN), silicon oxynitride ($SiOXN_y$).

13. A method of forming a semiconductor device, the method comprising:
   providing a type III-V semiconductor wafer comprising a plurality of die sites and a dicing strip separating the die sites from one another;
   forming one or more electrically inactive alignment features in the dicing strip, each of the alignment features comprising a first lateral surface that is vertically offset from a main lateral surface of the type III-V semiconductor wafer, and first and second vertical sidewalls that extend between the first lateral surface and the main lateral surface; and
   forming an epitaxy blocker exclusively along the first and second vertical sidewalls of each of the alignment features such that the first lateral surface and the main lateral surface of the type III-V semiconductor substrate are exposed from the epitaxy blocker,
   epitaxially growing a semiconductor regrown layer on a portion of the III-V semiconductor wafer comprising the one or more alignment features;
   wherein, during the epitaxial growth of the semiconductor regrown layer, a material composition of the epitaxy blocker is such that epitaxial growth of the semiconductor regrown layer is prevented on the first and second vertical sidewalls of the one or more alignment features.

14. The method of claim 13, wherein the epitaxy blocker comprises one or more of: silicon dioxide (SiO2), silicon nitride (SiN), carbon nitride (CN), silicon oxynitride (SiOXNy).

15. The method of claim 14, wherein the epitaxy blocker comprises silicon nitride.

16. The method of claim 13, wherein forming the epitaxy blocker exclusively along the first and second vertical sidewalls of each of the alignment features comprises:
   depositing a conformal layer of the epitaxy blocker on a portion of the semiconductor wafer that includes the main lateral surface and the one or more alignment features; and
   removing portions of the conformal layer that form on the first lateral surface of each of the alignment features and the main lateral surface, wherein removing portions of the conformal layer that form on the first lateral surface of each of the alignment features comprises an anisotropic etching low damage plasma process.

17. A method of forming a semiconductor device, comprising:
   providing a type III-V semiconductor substrate;
   removing semiconductor material from the type III-V semiconductor substrate such that the type III-V semiconductor substrate comprises one or more alignment features extending away from a main lateral surface of the type III-V semiconductor substrate, each of the alignment features comprising a first lateral surface that is vertically offset from the main lateral surface, and first and second vertical sidewalls that extend between the first lateral surface and the main lateral surface;
   forming an epitaxy blocker on the first and second vertical sidewalls of each of the alignment features; and
   epitaxially growing a type III-V semiconductor regrown layer on a portion of the type III-V semiconductor substrate that includes the one or more alignment features,
   wherein the epitaxy blocker prevents the type III-V semiconductor regrown layer from forming on the first and second vertical sidewalls of the one or more alignment features,
   wherein forming the epitaxy blocker on the first and second vertical sidewalls of each of the alignment features comprises:
   depositing a conformal layer of the epitaxy blocker on a portion of the semiconductor type III-V semiconductor substrate that includes the main lateral surface and the one or more alignment features; and
   removing portions of the conformal layer that form on the first lateral surface of each of the alignment features and the main lateral surface.

* * * * *